United States Patent [19]
Sato

[11] Patent Number: 5,270,771
[45] Date of Patent: Dec. 14, 1993

[54] ALIGNER AND EXPOSURE METHOD FOR MANUFACTURING SEMICONDUCTOR DEVICE

[75] Inventor: Makoto Sato, Tokyo, Japan

[73] Assignee: Canon Kabushiki Kaisha, Tokyo, Japan

[21] Appl. No.: 939,713

[22] Filed: Sep. 2, 1992

[30] Foreign Application Priority Data

Sep. 4, 1991 [JP] Japan .................. 3-250323

[51] Int. Cl.⁵ .................. G03B 27/52; G03B 27/42
[52] U.S. Cl. .................. 355/53; 355/30; 355/55
[58] Field of Search .................. 355/30, 53, 55; 353/101; 356/358

[56] References Cited

U.S. PATENT DOCUMENTS

| | | | |
|---|---|---|---|
| 4,666,273 | 5/1987 | Shimizu et al. | 353/101 |
| 4,668,077 | 5/1987 | Tanaka | 355/30 |
| 4,699,505 | 10/1987 | Komoriya et al. | 355/30 |
| 4,765,741 | 8/1988 | Detro et al. | 356/358 |
| 4,780,747 | 10/1988 | Suzuki et al. | 355/68 |
| 4,786,947 | 11/1988 | Kosugi et al. | 355/30 |
| 4,825,247 | 4/1989 | Kemi et al. | 355/55 |
| 4,907,021 | 3/1990 | Yabu | 353/101 |
| 4,974,018 | 11/1990 | Komoriya et al. | 355/53 |
| 5,025,284 | 6/1991 | Komoriya et al. | 355/53 |
| 5,105,075 | 4/1992 | Ohta et al. | 250/201.2 |
| 5,134,436 | 7/1992 | Fujioka | 355/30 |
| 5,137,349 | 8/1992 | Taniguchi et al. | 353/122 |

FOREIGN PATENT DOCUMENTS

0116940 8/1984 European Pat. Off.

Primary Examiner—Richard A. Wintercorn
Attorney, Agent, or Firm—Fitzpatrick, Cella, Harper & Scinto

[57] ABSTRACT

An aligner includes a system for projecting a pattern on an original plate onto a substrate, a stage for moving the substrate in two dimensions to sequentially project the pattern on the substrate, first and second devices for determining a change in projection magnification of the system in accordance with the output of a sensor for measuring at least one of temperature, humidity, and atmospheric pressure, and in accordance with the amount of illumination accumulated by detecting exposure light for exposing the substrate to the pattern, a device for sequentially detecting marks in first and second shot zones on the substrate when an interferometer measures the distance the stage is moved, a device for determining the ratio at which the substrate expands or contracts using the output of the detecting device, and a device for adjusting the magnification of the system for projecting the pattern, on the basis of an output from the ratio determining device and the first and second determining devices.

5 Claims, 4 Drawing Sheets

ALIGNER AND EXPOSURE METHOD FOR MANUFACTURING SEMICONDUCTOR DEVICE

BACKGROUND OF THE INVENTION

1. Field of the Invention

The present invention relates to a projection aligner which utilizes, in the process of manufacturing a semiconductor device, a projection optical system to project and align an electronic circuitry pattern onto a semiconductor substrate, and to an exposure method using such an aligner.

2. Description of the Related Art

In projection aligners, when alignment marks formed on semiconductor substrates or wafers are detected, the result of the detection is used to align wafers with masks or reticles on which electronic circuitry patterns are to be formed, and then an exposure operation is performed. There are two alignment methods. In a die-by-die method, alignment is carried out chip by chip formed on the wafer. In a global method, the positions of several chips on the wafer are determined, and the distance the entire wafer deviates from a desired position is computed on the basis of the distance each chip deviates. A wafer-mounting stage is moved to a position so that the distance each chip deviates decreases to a minimum, and then alignment is performed. The wafer-mounting stage can be moved to align the center of each chip. However, the magnification of a projection lens must be changed in order to align points within each chip. During this operation, conventionally, the chip magnification with which each chip is formed is calculated on the basis of the gaps between a plurality of alignment marks within each chip, which marks have already been exposed collectively.

The accuracy with which the chip magnification is calculated depends upon the size of the chip formed. For example, when a 15 mm × 15 mm chip is formed on a 5-inch wafer, the gap between alignment marks is only 15 mm, whereas the size of the wafer is 125 mm. When one method is utilized to determine the positions of the alignment marks, the accuracy with which magnification (wafer magnification in this case) is calculated can be expected to increase approximately eight-fold because the marks of the entire wafer are measured. Chip magnification varies primarily during the process of manufacturing semiconductors. In general, manufacturing semiconductors includes a plurality of processes, in each of which wafers are subjected to various treatments, such as heating. The wafers may deform because of heat treatment and the like. When they deform, that is, expand or contract, chip magnification fluctuates. This fluctuation must be precisely calculated before alignment can be performed with accuracy, or otherwise exposure accuracy may deteriorate.

SUMMARY OF THE INVENTION

It is an object of the present invention to overcome the problems of the prior art.

It is another object of the present invention to provide an aligner and a method for use in manufacturing semiconductor devices which reduces the positional deviation of a wafer with respect to a reticle caused by expansion or contraction of the wafer during the manufacturing process.

It is still another object of the present invention to provide an apparatus for aligning a reticle and a wafer and a manufacturing method for manufacturing a semiconductor which improves the accuracy with which the magnification of the pattern on the reticle is calculated.

It is still another object of the present invention to provide an improved exposure method for use in manufacturing a semiconductor device.

To achieve the above-mentioned objects in a projection aligner, the present invention provides a wafer, which is a substrate to be exposed, mounted on a stage capable of moving in two dimensions. The positional deviation of the wafer is measured so as to align the wafer with a mask. In such an aligner, positioning measuring means, such as a laser interferometer, measures the position of a wafer stage on which the wafer is mounted. The laser interferometer is affected by fluctuations in the atmosphere where the measuring system is positioned. Changes in pressure, temperature, and humidity of the atmosphere alter the wavelength of light emitted from the laser, thereby causing errors in measuring the position of the stage. For this reason, the laser interferometer measures the temperature, the humidity and atmospheric pressure and corrects the laser wavelength by using such measurements.

Changes in the environment also alter the imaging magnification of a projection optical system for projecting light from the mask to the wafer. Therefore, the atmospheric pressure is measured and the imaging magnification is also adjusted to conform to changes in atmospheric pressure.

The imaging magnification of the projection optical system changes when the exposure operation is repeatedly performed. Consequently, the number of exposure operations is accumulated and the accumulated value is calculated to correct the imaging magnification.

By appropriately performing the above two types of correction, the accuracy with which magnification is calculated using such measurements improves markedly when compared to a conventional aligner.

According to the projection aligner of the present invention, the marks on the chips on the wafer are measured and the expansion or contraction of the wafer is calculated from the measured positions. This calculation adjusts the imaging magnification of the projection optical system, thus correcting the positional deviation of the wafer caused by the expansion or contraction of the wafer. This correction improves the accuracy with which chip magnification is calculated, and therefore improves the accuracy of aligning points within the chip.

According to one aspect, the present invention which achieves one or more of these objectives relates to an aligner comprising an illumination system for illuminating an original plate with exposure light, a projection optical system for projecting a pattern onto a substrate, the pattern being formed on the original plate illuminated with the exposure light from the illumination system, a stage for moving the substrate in two dimensions so as to sequentially project the pattern formed on the original plate onto shot zones on the substrate, a laser interferometer for measuring the distance the stage is moved, an environment measuring device for measuring at least one of temperature, humidity and atmospheric pressure, a first magnification determining device for determining a change in projection magnification of the projection optical system, the determination being performed using an output of the environment measuring device, a second magnification determining device for determining a change in the projection magnification of the projection optical system, the determination being performed in accordance with an amount of illumination accumulated by detecting the exposure light, a mark detecting device for sequentially detecting marks in a first shot zone and marks in a second shot zone on the substrate, wherein when the mark detecting device sequentially detects the marks in the first and second shot zones, the laser interferometer measures the distance the stage is moved, an expansion and contraction ratio determining device for determining the ratio at which the substrate expands or contracts, the ratio determination being performed using an output of the mark detecting device, and a magnification adjusting device for adjusting, on the basis of the outputs of the expansion and contraction ratio determining device and the first and second magnification detecting devices, the projection magnification of the projection optical system. The measurement performed by the laser interferometer is corrected on the basis of the output of the environment device.

According to another aspect, the present invention which achieves one or more of these objectives relates to an aligner comprising an illumination system for illuminating an original plate with exposure light, a projection optical system for projecting a pattern onto a substrate, the pattern being formed on the original plate illuminated with the exposure light from the illumination system, a stage for moving the substrate in two dimensions so as to sequentially project the pattern formed on the original plate onto shot zones on the substrate, a laser interferometer for measuring the distance the stage is moved, a mark detecting device for sequentially detecting marks in a first shot zone and marks in a second shot zone on the substrate, wherein when the mark detecting device sequentially detects the marks in the first and second shot zones, the laser interferometer measures the distance the stage is moved, an expansion and contraction ratio determining device for determining the ratio at which the substrate expands or contracts, the ratio determination being performed using an output of the mark detecting device, and a magnification adjusting device for adjusting the projection magnification of the projection optical system. The mark detecting device detects the marks in the first and second shot zones without the aid of the projection optical system.

According to still another aspect, the present invention which achieves one or more of these objectives relates to an exposure method for use in manufacturing a semiconductor device, comprising the steps of: providing a projection optical system which projects a pattern onto a substrate, the pattern being formed on an original plate illuminated with exposure light; sequentially projecting the pattern onto shot zones on the substrate by using a stage which moves the substrate in two dimensions; measuring at least one of temperature, humidity and atmospheric pressure; determining a change in projection magnification of the projection optical system and generating a first detected magnification value based thereon, the determination being performed using a measurement obtained by measuring at least one of the temperature, humidity and atmospheric pressure; determining a change in projection magnification of the projection optical system and generating a second detected magnification value based thereon, the determination being performed in accordance with an amount of illumination accumulated by detecting the exposure light; sequentially detecting, with a mark detecting device, a shot zone and marks in a second shot zone on the substrate; determining the ratio at which the substrate expands or contracts, the ratio determination being performed using an output of the mark detecting device; adjusting the projection magnification of the projection optical system, the adjustment being performed on the basis of the first and second detected magnification values and the expansion or contraction ratio; and illuminating the original plate with the exposure light.

The foregoing and other objects, advantages, and features of the present invention will become more apparent from the following detailed description of the preferred embodiments taken in conjunction with the accompanying drawings.

DESCRIPTION OF THE PREFERRED EMBODIMENTS

Figure 1:
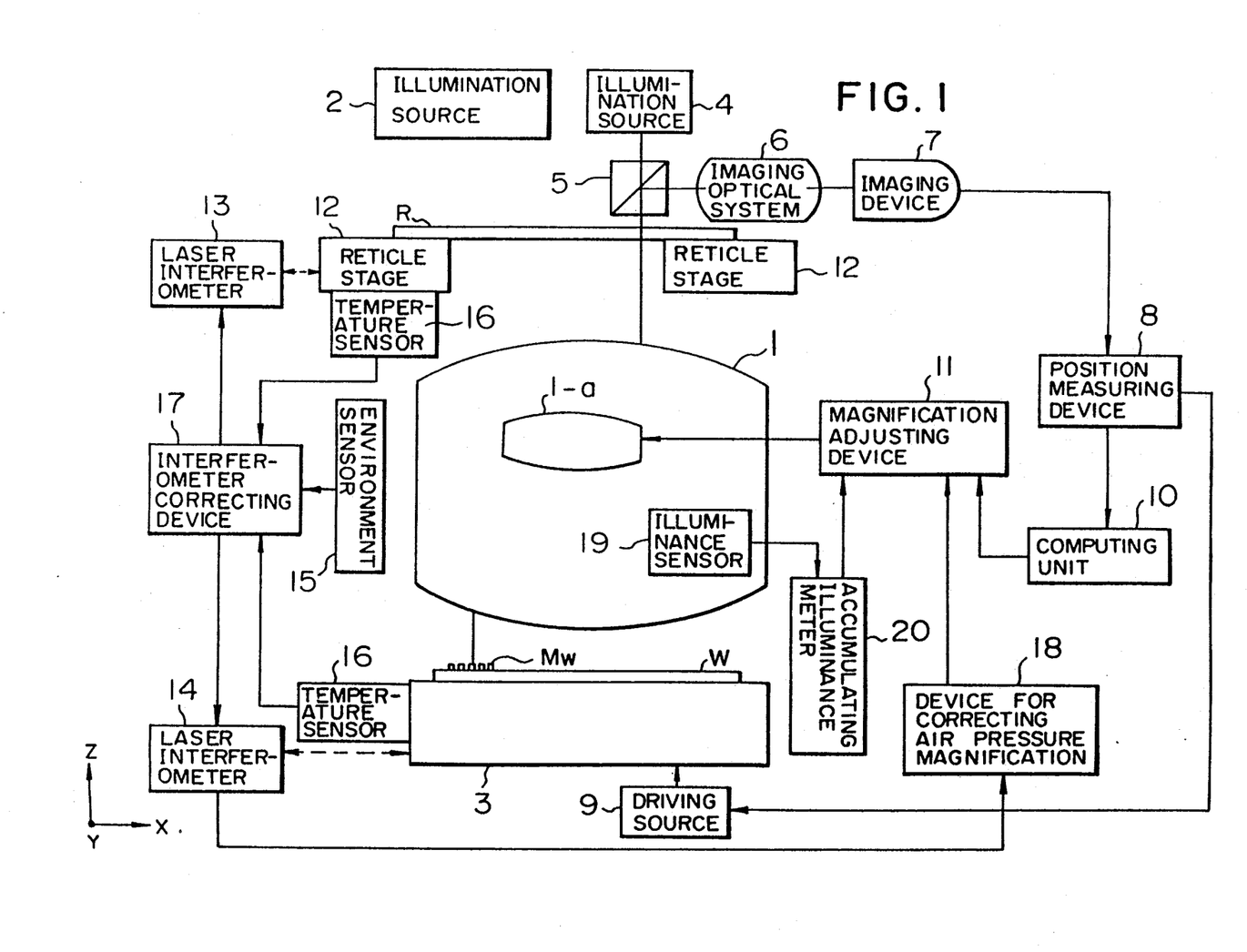
FIG. 1 is a schematic view showing an embodiment of an aligner in accordance with the present invention.

FIG. 1 is a schematic view showing the main components of a projection aligner to which the present invention applies. A light beam is emitted from an illumination source 2 used for exposure purposes. It projects an electronic circuitry pattern onto a wafer W mounted on a wafer stage 3 capable of moving two-dimensionally, which pattern is formed on a reticle R mounted on a reticle stage 12 capable of moving two-dimensionally. This projection is performed with the aid of a projection lens 1. The reticle stage 12 and the wafer stage 3 have laser interferometers 13 and 14, respectively, along two axes X and Y. The laser interferometers 13 and 14 measure the positions of the stages with high accuracy. Numeral 15 denotes an environment sensor which, at any time, monitors at least one of the following: the ambient temperature, humidity, and atmospheric pressure, and transmits monitored values to an interferometer correction device 17. Temperature sensors 16 measure the temperatures of the reticle R and the wafer W mounted on the stages 3 and 12, respectively. The interferometer correction device 17 corrects the value of the laser wavelength which is used as a measurement reference value and is stored in this device 17 so that the laser wavelength used for calculating measurements can be corrected to an appropriate value. This correction is based on measurements input from the environment monitoring sensor 15 and the temperature sensors 16. The interferometer correction device 17 uses the temperature of the stages to calculate the expansion or contraction of the stages, and corrects the value of the laser wavelength by considering the expansion or contraction of the stages.

Figure 2:
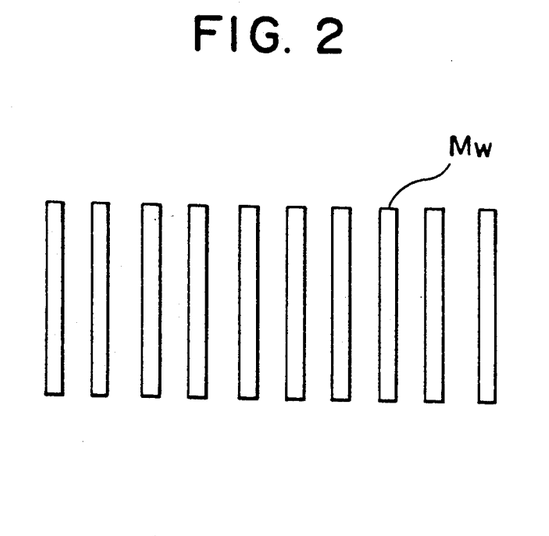
FIG. 2 is a schematic view of aligning marks formed on a wafer.

Numeral 18 denotes a device for correcting atmospheric pressure magnification of the projection lens 1 (hereinafter referred to as the pressure magnification correcting device). The projection lens 1 is used for reducing the pattern on the reticle R and projecting it onto the wafer W. The pressure magnification correcting device 18 receives data on the atmospheric pressure from the interferometer correction device 17, calculates the fluctuation in magnification caused by fluctuations in the atmospheric pressure, and then outputs data on the fluctuation in magnification to a magnification adjusting device 11. Numeral 19 denotes an illuminance sensor which transmits detected illuminance to an accumulating illuminance meter 20 every time an exposure operation is performed. A light beam is emitted from an illumination source 4 used for alignment purposes, passes through a beam splitter 5 and the projection lens 1, thus illuminating wafer marks $M_w$ on the wafer W. The wafer marks are grate-like marks as shown in FIG. 2. The light beam is reflected from the wafer W and then reaches the beam splitter 5 through the projection lens 1. The light beam is then reflected from the beam splitter 5, passes through an imaging optical system 6, and then reaches an imaging device 7, such as a charge coupled device (CCD) camera. An image of the wafer marks $M_w$ is formed on the imaging surface of the imaging device 7. An analog output from the imaging device 7 is converted by a position measuring device 8 into a two-dimensional digital signal. A template of the wafer marks $M_w$ has already been stored in the position measuring device 8. The pattern of the wafer marks $M_w$ imaged by device 7 is matched with the pattern of the wafer marks $M_w$ from the stored template by computations performed by the position measuring device 8. This computation determines the positions of the wafer marks $M_w$ relative to the imaging device 7 to the highest degree of accuracy. The position of the reticle R relative to the imaging device 7 is calculated by calculating means (not shown) and stored in the position measuring device 8, which computes the deviation from the relative positions of the reticle R and the wafer W. Numeral 10 denotes a computing unit which receives data on the above-mentioned deviation, computed by the position measuring device 8, to calculate the expansion or contraction of the wafer W. The magnification adjusting device 11 adjusts the imaging magnification of the projection lens 1. This adjustment is based on inputs from the computing unit 10, the pressure magnification correcting device 18 and the accumulating illuminance meter 20.

In operation, the interferometer correction device 17, at any time, corrects the value of the laser wavelength by considering not only fluctuations in the laser wavelength caused by changes in the physical properties of the atmosphere, but also the expansion or contraction of the wafer caused by changes in the temperature of the stage. This correction is based on measurements made by the environment sensor 15 and temperature sensors 16. Such an operation corrects magnification errors of the stage. At the same time, atmospheric pressure measured by the environment sensor 15 is output to the pressure magnification correcting device 18. This device 18, at any time, transmits to the magnification adjusting device 11 the amount the projection magnification is changed due to fluctuations in atmospheric pressure. The accumulating illuminance meter 20 accumulates the amount of illuminance every time an exposure operation is performed and outputs an accumulated value to the magnification adjusting device 11. In this way, the magnification adjusting device 11 calculates a correction coefficient K, which takes into account changes in atmospheric pressure and in projection magnification caused by the energy absorption of the projection lens 1 attendant to the exposure operation.

Figure 3:
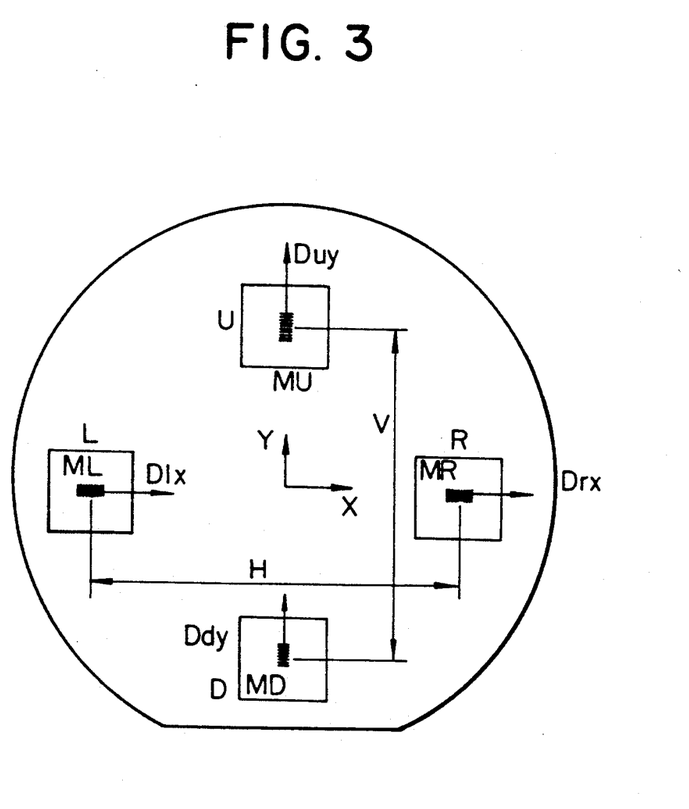
FIG. 3 is a view showing the relative positions of the aligning marks on a wafer.

It is assumed that the wafer W has already been mounted on the stage 3 by mounting means (not shown) and has been aligned substantially with the reticle R. It is also assumed that chips, such as those shown in FIG. 3, are formed on the wafer W. The stage 3 first moves so that wafer marks ML on a chip indicated by L in FIG. 3 enter the visual field of the imaging device 7. The method described previously is used to measure the distance Dlx that the wafer marks ML deviate along the X axis. Then, the stage 3 moves so that wafer marks MR on a chip indicated by R in FIG. 3 enter the visual field of the imaging device 7. The laser interferometer 14 measures the distance H that the stage 3 moves in this operation. The distance Drx that the wafer marks MR deviate along the X axis is measured. The computing unit 10 calculates, from Dlx, Drx and H, the ratio Mx at which the wafer expands or contracts along the X axis. This calculation is based on the following equation:

$$Mx = (Drx - Dlx + H)/H$$

The stage 3 then moves so that wafer marks MU on a chip indicated by U in FIG. 3 enter the visual field of the imaging device 7. The laser interferometer 14 measures the distance V that the stage 3 moves in this operation. The distance Duy that the wafer marks MU deviate along the Y axis is measured in the same manner as described above. The stage 3 then moves distance V only so that wafer marks MD on a chip indicated by D in FIG. 3 enter the visual field of the imaging device 7. The distance Ddy that the wafer marks MD deviate along the Y axis is measured. The computing unit 10 calculates, from Duy, Ddy and V, the ratio My at which the wafer expands or contracts along the Y axis. This calculation is based on the following equation:

$$My = (Duy - Ddy + V)/V$$

The thus-calculated expansion or contraction ratios of the wafer, Mx and My, are output to the magnification adjusting device 11. This device 11 drives, on the basis of the above ratios Mx and My, a part 1-a of the projection lens 1 on the Z axis, that is, the optical axis direction of the projection lens 1 so that the projection magnification M of the projection lens 1 becomes M' as expressed by the following equation:

$$M' = M \times K \times 2/(Mx + My)$$

where K is the correction coefficient determined previously to correct changes in magnification caused by the exposure operation and also by fluctuations in atmospheric pressure.

Figure 4:
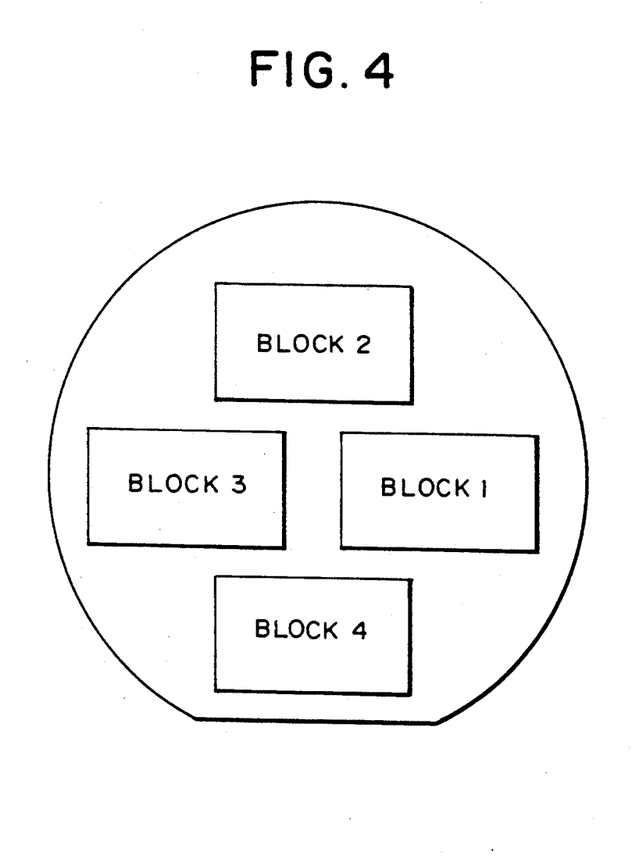
FIG. 4 is a schematic view of a wafer divided into several zones.

In this way, the magnification with which the pattern on the reticle R is projected is adjusted so that the expansion or contraction ratios of the wafer can be corrected. It is thus possible to cancel out errors which occur when the reticle R is aligned with the wafer W. Under such conditions, the exposure operation and stage movement are repeatedly performed for all chips on the wafer by either a die-by-die alignment method, by which alignment is carried out chip by chip, or the so-called global alignment method, by which alignment is carried out on the basis of the amount of deviation between the wafer and several chips on the wafer. A driving source 9 moves the stage 3 in either the X r Y direction to correct the positional deviation in either the X or y direction in the same manner used when correcting the positional deviation in either the X or Y direction determined by the position measuring device 8. In the above-described embodiment, four sets of wafer marks on four chips on a single wafer are measured to determine the expansion or contraction ratio of the entire wafer. However, with an increase in the diameter of wafers, the expansion or contraction ratios of the wafer vary according to the positions of chips on the wafer. In such a case, as shown in FIG. 4, a wafer is divided into several blocks so that the expansion or contraction ratios of the wafer for each block can be determined. The magnification of the projection lens 1 may be adjusted for each block. When the expansion or contraction ratios of the wafer and the correction coefficient for each block are expressed, respectively, as follows:

Mxi, Myi and Ki, in which i = 1, 2, 3 and 4, the projection magnification for each block is adjusted to satisfy the following equation:

$$M'i = M(Ki2/(Mxi + Myi))$$

where i = 1, 2, 3 and 4.

Figure 5:
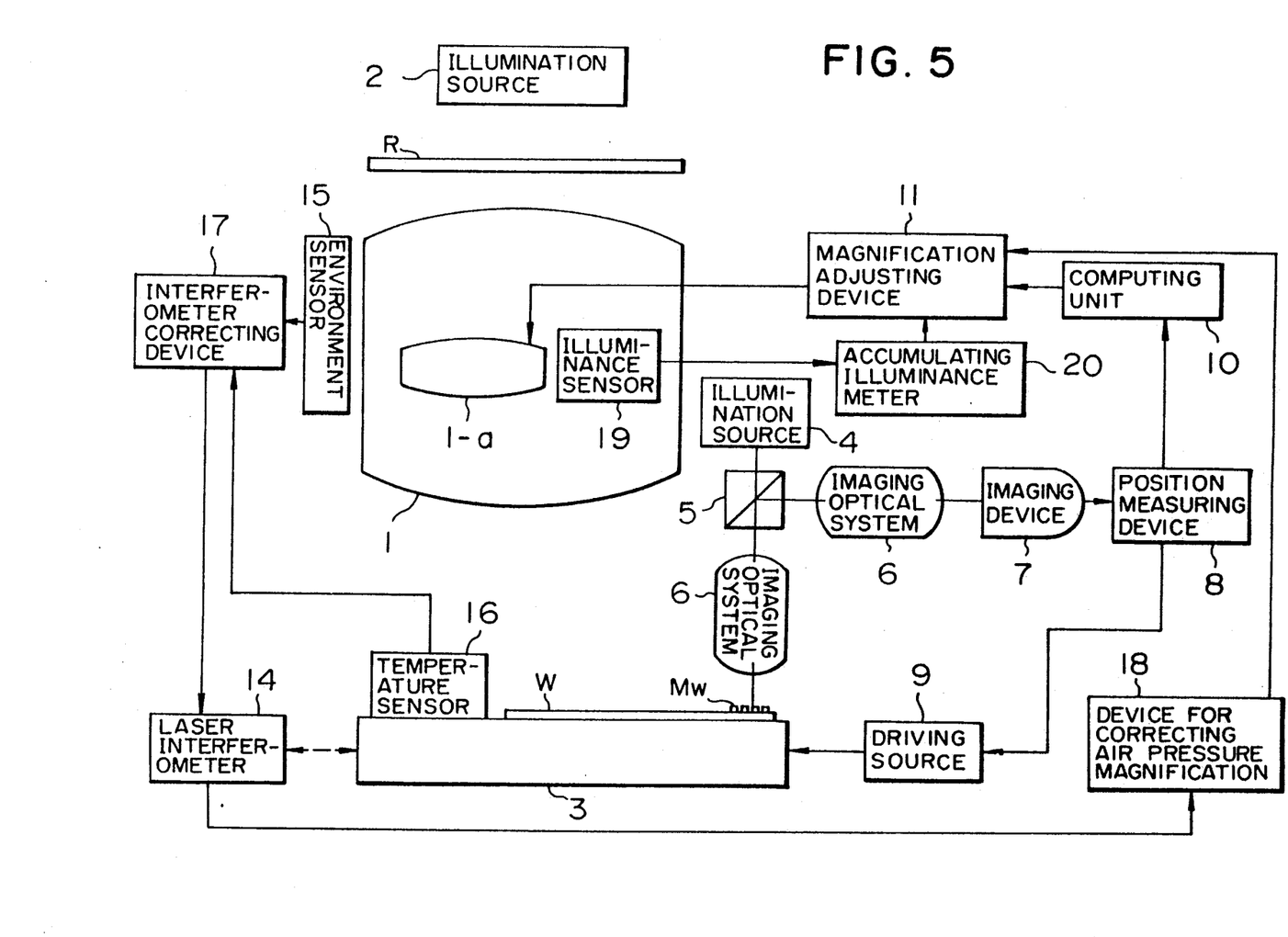
FIG. 5 is a schematic view showing another embodiment of an aligner in accordance with this invention.

FIG. 5 shows a second embodiment of this invention. Components which are the same or similar to components shown in FIG. 1 are denoted by the same reference numerals. In this embodiment, the marks Mw are measured without the aid of the projection lens 1. This feature makes the second embodiment different from the first embodiment, in which the marks Mw are measured with the aid of the projection lens 1. In this embodiment, the imaging device 7 forms the marks Mw on the wafer W into an image with the aid of the imaging optical system 6. The imaging optical system 6 is disposed near the projection lens 1 and outside the optical path of the light travelling from the wafer W through the lens 1 at a predetermined position relative to the lens 1. The reticle R is fixed in a predetermined position relative to the projection lens 1. The structure and operation of the device other than that described above are the same as in the first embodiment shown in FIG. 1, and the explanations thereof are not repeated.

In the embodiments described above, although the lens of the projection optical system is moved to adjust projection magnification, pressure between appropriate lenses in the projection optical system may be changed to adjust the projection magnification.

As has been described, this invention makes it possible to correct alignment errors between the reticle and wafer caused by the expansion or contraction of the wafer, so that the reticle is aligned with the wafer with high accuracy.

The individual components represented by the blocks shown in FIGS. 1 and 5 are well-known in the semiconductor manufacturing art and their specific construction and operation is not critical to the invention or the best mode for carrying out the invention. Moreover, the steps recited in the specification for carrying out the present invention can be easily programmed into well-known central processing units by persons of ordinary skill in the art and since such programming per se is not part of the invention, no further description thereof is deemed necessary.

What is claimed is:

1. An aligner comprising:

an illumination system for illuminating an original plate with exposure light;

a projection optical system for projecting a pattern onto a substrate, the pattern being formed on the original plate illuminated with the exposure light from said illumination system;

a stage for moving the substrate in two dimensions so as to sequentially project the pattern formed on the original plate onto shot zones on the substrate;

a laser interferometer for measuring the change of position said stage is moved;

an environment measuring device for measuring at least one of temperature, humidity and atmospheric pressure;

a first magnification determining device for determining a change in projection magnification of said projection optical system, the determination being performed using an output of said environment measuring device;

a second magnification determining device for determining a change in the projection magnification of said projection optical system, the determination being performed in accordance with an amount of illumination accumulated by detecting the exposure light;

a mark detecting device for sequentially detecting marks in a first shot zone and marks in a second shot zone on the substrate, wherein when said mark detecting device sequentially detects the marks in the first and second shot zones, said laser interferometer measures the change of position said stage is moved;

an expansion and contraction ratio determining device for determining the ratio at which the substrate expands or contracts, the ratio determination being performed using an output of said mark detecting device; and a magnification adjusting device for adjusting, on the basis of the outputs of said expansion and contraction ratio determining device and said first and second magnification detecting devices, the projection magnification of said projection optical system.

2. An aligner according to claim 1, wherein the measurement determined by said laser interferometer is corrected on the basis of the output of said environment measuring device.

3. An aligner comprising:

an illumination system for illuminating an original plate with exposure light;

a projection optical system for projecting a pattern onto a substrate, the pattern being formed on the original plate illuminated with the exposure light from said illumination system;

a stage for moving the substrate in two dimensions so as to sequentially project the pattern formed on the original plate onto shot zones on the substrate;

a laser interferometer for measuring the change of position said stage is moved;

a mark detecting device for sequentially detecting marks in a first shot zone and marks in a second shot zone on the substrate, wherein when said mark detecting device sequentially detects the marks in the first and second shot zones, said laser interferometer measures the change of position said stage is moved;

an expansion and contraction ratio determining device for determining the ratio at which the substrate expands or contracts, the ratio determination being performed using an output of said mark detecting device; and a magnification adjusting device for adjusting the projection magnification of said projection optical system.

4. An aligner according to claim 3, wherein said mark detecting device detects the marks in the first and second shot zones without the aid of said projection optical system.

5. An exposure method for use in manufacturing a semiconductor device, comprising the steps of:

providing a projection optical system which projects a pattern onto a substrate, the pattern being formed on an original plate illuminated with exposure light;

sequentially projecting the pattern onto shot zones on the substrate by using a stage which moves the substrate in two dimensions;

measuring at least one of temperature, humidity and atmospheric pressure;

determining a change in projection magnification of said projection optical system and generating a first detected magnification value based thereon, the determination being performed using a measurement obtained by measuring at least one of the temperature, humidity and atmospheric pressure;

determining a change in projection magnification of the projection optical system and generating a second detected magnification value based thereon, the determination being performed in accordance with an amount of illumination accumulated by detecting the exposure light;

sequentially detecting, with a mark detecting device, marks in a first shot zone and marks in a second shot zone on the substrate;

determining the ratio at which the substrate expands or contracts, the ratio determination being performed using an output of said mark detecting device;

adjusting the projection magnification of the projection optical system, the adjustment being performed on the basis of the first and second detected magnification values and the expansion or contraction ratio; and illuminating the original plate with the exposure light.

* * * * *

UNITED STATES PATENT AND TRADEMARK OFFICE
CERTIFICATE OF CORRECTION

PATENT NO. : 5,270,771
DATED : December 14, 1993
INVENTOR(S) : MAKOTO SATO

It is certified that error appears in the above-indentified patent and that said Letters Patent is hereby corrected as shown below:

ON THE COVER PAGE
   AT [56] References Cited Under U.S. Patent Documents
   Insert: --4,870,288 Abuke et al. .... 250/548; 4,496,239 1/1985 Isohata et al. .... 355/30; 4,659,227 Sato et al. .... 356/401--.

COLUMN 4
   line 4, "device, a shot" should read --device, marks in a first shot--.

COLUMN 6
   line 68, "X r Y" should read --X or Y--.

COLUMN 7
   line 2, "y direction" should read --Y direction--.

Signed and Sealed this

Twenty-eighth Day of June, 1994

Attest:

BRUCE LEHMAN

*Attesting Officer*   *Commissioner of Patents and Trademarks*